United States Patent [19]

Belt et al.

[11] Patent Number: 4,962,087
[45] Date of Patent: Oct. 9, 1990

[54] EPITAXIAL SUPERCONDUCTING SCRUCTURE ON LATTICE MATCHED LANTHANUM ORTHOGALLATE

[75] Inventors: Roger F. Belt, Morristown; Robert Uhrin, Brookside, both of N.J.

[73] Assignee: Litton Systems, Inc., Morris Plains, N.J.

[21] Appl. No.: 164,101

[22] Filed: Mar. 4, 1988

[51] Int. Cl.$^5$ .................. C30B 7/10; C30B 29/22
[52] U.S. Cl. ........................... 505/1; 156/610; 252/521; 420/901; 505/729
[58] Field of Search .............. 156/610; 372/41; 505/1, 505/729; 252/521

[56] References Cited

U.S. PATENT DOCUMENTS 4,316,785  2/1982  Suzuki .................................. 427/63

FOREIGN PATENT DOCUMENTS 0199440  10/1986  European Pat. Off. ............ 156/621
266751   2/1973   U.S.S.R. .

OTHER PUBLICATIONS

E. J. Baran-Infrared Spectrum of LaGaO$_3$; 1975; pp. 3572-3575.
Naturforsch; National University of LaPlata, Argentina, pp. 136-137.
J. Yang et al.-On the Luminescence of Perovskite Type Rare Earth Gallates; 1985; New Front, Rare Earth Sci., vol. 2, pp. 860-863.
G. Sallavuard et al.-Lanthanide Monogallates; Mar. 1969; C. R. Academy of Sciences, Paris; pp. 1050-1053.
M. Mizuno et al.-Phase Diagram of the System Gallium Trioxide-Lanthanum Oxide at High Temps.; Gov't. Industrial Research Institute, 1985; pp. 295-300.
D. Lefebvre et al.-Substituted Lanthanum Hexagallates a . . . Substrates; Materials Research Bulletin, vol. 22; pp. 1039-1045 (1987).
G. F. Ruse et al.-Growth of Neodymium Gallium Oxide Crystals; Journal of Crystal Growth 29 (1975) pp. 305-308.
Chaudhari et al., Phys. Rev. Letts., 58 (1987) 2684.
Gupta et al., Appl. Phys. Letts, 52 (Jan. 1988) 163.
Sandstrom et al., Appl. Phys. Lett. 53 (Nov. 1988) 1874.
Ruse et al., Jour. Crystal Growth, 29 (1975) 305-8.

*Primary Examiner*—Upendra Roy
*Attorney, Agent, or Firm*—Michael R. Wallach; Robert F. Rotella

[57] ABSTRACT

A thin film superconducting device is described in which the substrate is a single or mixed single crystal of lanthanum orthogallate grown from a pure melt of lanthanum, gallium and additive oxides. A portion of the gallium single crystal can be replaced by Sc, Al or In and/or a portion of the lanthanum can be replaced by a rare earth element of smaller ionic radius than lanthanum to allow for manipulation of the lattice constant.

10 Claims, No Drawings

EPITAXIAL SUPERCONDUCTING SCRUCTURE ON LATTICE MATCHED LANTHANUM ORTHOGALLATE

"This application is related to patent application Ser. Nos. 07/164,235 and 07/164,110 each of which were filed on the same data as this application and which are owned by the assignee of this application."

BACKGROUND OF THE INVENTION

I. Field of the Invention

This invention relates to the field of superconducting devices. The invention involves superconductor substrates comprised of monocrystalline lanthanum orthogallate and mixed single crystals of lanthanum orthogallate. In accordance with the invention, lanthanum orthogalate, and mixed crystals thereof can be produced in the form of large perovskite-type single crystals. Specifically, the invention relates to the discovery of a new crystalline substrate on which $T_c$ superconducting thin film of metal oxide based perovskite are deposited. The substrate found suitable for this purpose is a single or mixed single crystal of lanthanum orthogallate. The crystal from which the substrate is fabricated are grown from a pure melt of lanthanum, gallium and additive oxide while controlling the major crystallographic direction of solidification.

II. Description of the Prior Art

The mineral perovskite ($CTiO_3$) serves as a prototype crystal structure for a large class of compounds of general formula $ABO_3$. In this structure, the A element is a large cation while the B element is a smaller cation. In order to maintain charge neutrality in the compound, the sum of the cation valence states should total six. Thus, various combinations of A and B valence states are possible, e.g. 3—3, 2-4, 1-5 and even mixed fractional compositions The ideal perovskite crystal structural is cubic where 8(A)ion are locate at the cube corners, 6(0)ions at the cube faces and a single B ion at the cube center. In a practical situation, most perovskite structures are distorted from cubic to tetragonal, rhombohederal, or orthorhombic crystal forms. The perovskite structure is likely to be generated where A cations are coordinated with 12 oxygen ions and B cations with 6 oxygen. It was shown first by V. M. Goldschmidt in Skrifter Norske Videnskops Akad, Oslo, I, Mat. - Naturv. Kl., No. 8 (1926) that a cubic perovskite is stable only if a tolerance factor has an approximate range of $0.8 < t < 0.9$. Here t is defined by $R_A$ & $R_O = t\sqrt{2}$ ($R_B + R_O$ where $R_A$, $R_B$, and $R_O$ are ionic radii of the A, B, and 0 ions respectively. For distorted structures, t may have a larger tolerance. The perovskite structure is very important as a basis for semiconductors, thermoelectrics, ferroelectrics, laser hosts, catalysts, and ferromagnetic material. A modern discussion of these applications in len in the boom "Structure, Properties, and Preparation of Perovskite - Type Compounds " by F. S. Galasso, Pergamon Pres, New York, 1969. The perovskite relate high Tc superconductor oxides of type $La_{1.85}Ba_{.15}CuO_{4-x}$ and $YBa_2Cu_3O_{7-x'}$ which were discovered in 1987, have again brought this structure into technical prominence. $ABO_3$ compounds other than $CaTiO_3$ (perovskite) which possess the perovskite crystal structure are alternatively referred to as "perovskite-type", "perovskite-like" or "perovskite-related" A used herein when referring to compositions other than $CaTiO_3$, the term "perovskite" describes the crystalline structure of such compositions.

The compound $LaGaO_3$ was prepared first as a polycrytalline powder, characterized, and reported as a perovskite-like structure by S Geller, in Acta Cryst 10, 243 (1957). Geller determined by X-ray diffraction, the structure at room temperature to be an orthorhombic crystal with the following unit cell dimensions: a=5.496 A, b=5.524 A, and c=7.787 A. Small single crystals, ca, 1-5 mm in size, were grown from a $PbO-B_2O_3$ flux as reported by M. Marezio, J. P. Remeika and P. D. Dernier in Inorganic Chemistry 7, 1337 (1968). These workers again-determined the crystals to be orthorhombic with the following lattice constants: a=5.526 A b=5.473A and c=7.767 A. Several years later a reinvestigation of the $La_2O_3-Ga_2O_3$ system solid state reaction showed a similar result for $LaGaO_3$. See S. Geller, P. J. Curlander and G. F. Ruse in Mat. Res. Bull. 9, 637 (1974) Geller reported measurement of the orthorhombic unit cell a follow: a=5.519 A, b=5.494 A, and c=7.770 A.

The phase diagram of the $La_2O_3-Ga_2O_3$ system was studied in a preliminary fashion by S. J. Schneider, R. S. Roth and J. L. Waring, J. Research Natl, Bur. Standard 65A [4]365 (1961). Schneider et al. found that the perovskite phase existed t the stoichiometric 1:1 composition. However, it t indicated whether this composition or those adjacent within few mOle percent were either congruently or incongruently melting. Generally mixtures of a high melting component ($La_2O_3$) with a partially volatile low melting component such as $Ga_2O_3$ are difficult to control compositionally at or near the melting point of the stoichiomitric mix. The prior art has not recognize that boules capable of providing monocrystalline lanthanum orthogallate or mixed single crystals of lanthanum orthogallate of predetermined orientation could be readily grown from pure melts.

Monocrytalline lanthanum orthogallate or mixed single crystals of lanthanum orthogallate have not heretofore been used as substrates for any superconductor materials. III. Invention Contrasted From the Prior Art In accordance with the preset invention, it has unexpectedly been found contrary to what is suggested by previous investigators that powdered stoichiometric mixtures of La and Ga at the 1:1 $Ga_2O_3$ composition melt stably and apparently congruently with little or no evolution of $Ga_2O_3$; that the resulting stable melts of about 1:1 composition are low melting, circa 1675° C. by uncorrected pyrometer, a temperature near the $Ga_2O_3$ melting point; that such pure melts can be forced and retained in iridium crucibles for sufficient time to practice the Czochralski method of growth; that such melted can be seeded by an iridium wire to obtain a single provkite-type crystal near a preferred [110] orientation; that seed growth via oriented single crystal can produce large boule in [110] orientation or other favorable orientations, viz. [100], [010], or [001]; that mixed single crystals of lanthanum orthogallate can be grown using the same method employed to produce large lanthanum orthogallate single crystals of predetermined orientation; and, that by selection and substitution of certain cations for either La or Ga cations in lanthanum orthogallate single crystals; that is, by formation of mixed single crystals of lanthanum orthogallate—a substantially lattice-matched surface for superconductor films of pervoskite-type architecture can be fabricated from single crystals or mixed single crystals of lanthanum orthogallate.

SUMMARY OF THE INVENTION

It is the object of the resent invention to obtain lanthanum orthogalate monocrystals grown along predetermined crystallographic directions of useful size for applications requiring sizes exceeding those of the randomly grown minutely sized crystals of the prior art, described above.

In its broad aspect the present invention related to monocrytalline lanthanum orthogallate grown along the predetermined crystallographic direction. The monocrystalline lanthanum orthogallate is in the form of a ingle crystal of a size greeter than 1 cm in diameter/with and at least 10 c in length.

In accordance with the present invention a new class of perovskite type monocrytalline substrate has been developed. The class of materials is based on lanthanum orthogallate which has been discovered to readily grow from a sure melt along predetermined crystallographic direction. Include in the class of suitable perovskite-type monocrytalline substrates are single crystal of the following formula:

1. $LaGa_{1-y}Sc_yO_3$
2. $LaGa_{1-y}Al_yO_3$
3. $LaGa_{1-y}In_yO_3$ wherein y may be 0.001–0.5 and for most applications is 0.01–0.2.

The compositions in which either Sc, Al or In are substituted for Ga in the crystal structure allow for the manipulation of the lattice constant of the monocrystalline substrate; that is, such substitution can be used to "tune" the lattice unit cell.

Where it is desirable to increase the lattice constant in addition to, or as an alternative for, substitution of $Al^{3+}$ for $Ga^{3+}$ it is possible to us $In^{3+}$ in place of $Al^{3+}$. $Fe^{3+}$ should not be used because of its ferromagnetic properties.

Also included in the class of suitable perovskite-type monocrystalline substrates are single crystals of the following formula:

$$R_xLa_{1-x}GaO_3$$

wherein R is a rare earth element of smaller ionic radium than La and wherein x may be 0.001 - 0.5 and for most applications is 0.01–0.2

In addition, the class of perovskite-type monocrytalline substrate includes single crystal of the following formulae:

$$R_xLa_{1-x}Ga_{1-y}Al_yO_3$$

$$R_xLa_{1-x}Ga_{1-y}Sc_yO_3$$

$$R_xLa_{1-x}Ga_{1-y}In_yO_3$$

wherein R is e rare earth element of smaller ionic radius than La and wherein x and y may be the same or different an are within the range of from 0.001–0.5 and for most applications is 0.01–0.2.

It is also possible, in accordance with this invention, to decrease the lattice constant by substituting rare earth elements of smaller ionic radii for La. The rare earth elements that can be substituted for La are Ce, Pr, Nd, Pm, Sm, Eu, Gd, Tb, Dy, Ho, Er, Tm, Yb and Lu. Where a colorless substrate is desired then the rare earth elements/metals that can be substituted for La are Gd, Yb, Lu and Y.

The mixed single crystals of the present invention can readily be grown in dimensions greater than 1 cm in diameter and 10 cm in length and in boule sizes equivalent to those of the monocrystalline lanthanum orthogallate of the present invention.

The monocrystalline materials of the present invention are particularly adapted to function as lattice-matched substrates. Specifically such materials my be used as substrates to form a superconducting device comprising lattice-atoned substrate on which a fill is deposited of high Tc superconducting metal oxide based perovskite.

Another aspect of the present invention related to a method of growing a monocrytalline lanthanum orthogallate along a predetermined crystallographic direction. The method comprise the step of forming a mixture of $La_2O_3$ and $Ga_2O_3$; heating said mixture to form a melt of uniform composition in a controlled atmosphere; and, cooling said melt to form said monocrytalline lanthanum orthogallate. Preferably the mixture of $La_2O_3$ and $Ga_2O_3$ is stoichiometric.

Yet another aspect of the present invention relate to a method of growing a mixed monocrystalline lanthanum orthogalate along a predetermined crystallographic direction. The method comprises the steps of forming a mixture of $La_2O_3$, $Ga_2O_3$ and an oxide of the cation selected as a substrate for a portion of La and/or Ga in the crystal; heating said mixture to form a melt of uniform composition in a controlled atmosphere; and, cooling said melt to form said mixed monocrystalline lanthanum orthogallate. Preferably the mixture of $La_2O_3$, $Ga_2O_3$ and selected substitute oxide is stoichiometric.

The amounts of ingredients in the stoichiometric mixture can vary from the exact stoichiometric quantities calculated from the monocrystalline or mixed monocrytalline product. Variations of up to about ±5 percent can be tolerated without adversely affecting the desired oriented single crystalline product. Thus for purposes of calculation toichiometric ratio variation of ±2 percent can be used.

Yet another aspect of the present invention involve growing monocrystalline lanthanum orthogallate or mixed monocrytalline lanthanum orthogallate by the Czochrali method. This method comprises the steps of forcing a mixture of $La_2O_3$ and $Ga_2O_3$ or $La_2O_3$, $Ga_2O_3$ and an oxide elected from the ground consisting of Al, Ga, In, Y, rare earth elements of smaller diameter than La and mixture thereof, preferably in stoichiometric amounts; hating said mixture to form a melt of uniform composition in a controlled atmosphere; initiating growth of said crystal on nucleating means for holding and pulling said crystal from the melt; and pulling the crystal formed on the nucleating means. The nucleating means is preferably an oriented seed crystal, although it has been found in accordance with the present invention that the nucleating means may be an inert material stable at the temperature of the melt, e.g. iridium. The controlled atmosphere may be inert, an oxidizing atmosphere or a reducing atmosphere.

DETAILED DESCRIPTION OF THE INVENTION

The purity of the oxides that are mixed to form the melt for forming monocrystalline lanthanum orthogallate or mixed monocrystalline lanthanum orthogallate suitable is a least about 99.9%. Oxide purity of about 99.99% or greater is preferably used. In accordance with the present invention boules of a size of about 0.7 inch diameter or greater and 4 inch in length or larger are obtained and sizes of 1 inch or greater diameter and 5-6 inches in length or even larger are capable of being grown using a pure melt. In accordance with the present invention, monocrystalline lanthanum orthogallate may be formed using pure melt (a melt consisting essentially of $La_2O_3$ and $Ga_2O_3$) in sizes of at least one centimeter in diameter and 10 cm. in length. A substantially stoichiometric ratio of $La_2O_3$ and $Ga_2O_3$ is used to form a uniform pure melt for monocrystalline lanthanum orthogallate.

It is possible to obtain a monocrystalline product utilizing admixtures of lanthanum and gallium oxides outside the stoichiometric ratios required fOr lanthanum orthogallate formation but not necessarily with the same results; that is, variations in the refractive index and crystal quality may occur.

Also, in accordance with the present invention, mixed monocrystalline lanthanum orthogallate may be formed using a pure melt (a melt consisting essentially of $La_2O_3$ and $Ga_2O_3$ and an oxide selected from the group consisting of Al, Ga, In, Y, rare earth elements of smaller diameter than La and mixtures thereof) in sizes of at least one centimeter in diameter and 10 cm. in length A substantially stoichiometric ratio of $La_2O_3$, $Ga_2O_3$ and other oxides is use to form a uniform pure melt or monocrystalline lanthanum orthogallate.

The oxide mix is suitably in powder form with oxide particle sizes typically used to form melts, e.g. preferred.

It is possible to obtain a monocrystalline product utilizing admixtures of lanthanum, gallium and other selected oxides outside the stoichiometric ratio required for mixed ingle crystal lanthanum orthogallate formation A in the case of monocrystalline lanthanum orthogallate, use of such admixture will not necessarily produce the same results as when substantially stoichiometric mixtures are used.

The crystals of the present invention are suitably formed at atmospheric conditions that are oxidizing although the ability of the melt is such that it ia also possible to use inert atmospheric conditions. The use of an oxidizing atmosphere to suppress reduction of gallium oxide component of the mix is preferred. It should also be pointed out that the type of atmosphere used varies in accordance with the method of manufacture of the monocrystalline materials of the present invention.

Growth of monocrystalline lanthanum orthogallate or mixed monocrystalline lanthanum orthogallate can be in the [001], [010] or [100] orientations or in alternate orientations selected depending on the specific application for which the resulting crystal is to be used.

In accordance with the present invention, large single crystals of $LaGaO_3$ are used for fabrication of substrate material for deposition of oxidic superconductor single crystal thin films. For $LaGaO_3$, the lattice spacing of (110) planes is about 3.894. The superconducting compound defined by the formula $YBa_2Cu_3O_{7-x}$ has an orthorhombic crystal structure with a=3.856 A, b=3.870 A, and c=11.666 A as reported by T. Siegrist, S. Sunshine, D. W. Murphy, R. J. Cava and S. M. Zahurak, Phys Rev. B35, 7137 (1987). It is a known principle of epitaxial film growth that similar crystal structure and nearly matching lattice intended provide the most favorable situation for high quality fill deposition. (See L. I. Maissel and R Glang, editors, "Handbook of Thin Film Technology", I. H. Khan, Chapter 10, McGraw Hill, N.Y., 1970). In the superconductor material of the present invention the 3.894 A spacing for (110) oriented LaGaO wafer fall ideally near both the 3.856 A a axis and 3.870 A b axis pacing of $YBa_2Cu_3O_{7-x}$. Thus, (110) oriented ingle crystal films of $YBa_2Cu_3O_{7-x}$ are favorably disposed to form on (110) $LGaO_3$ with a minimum of strain, twins, or other defects which may limit the superconducting properties In fact, the strain is measured commonly by lattice constant variation. For $LaGaO_3$ these would be 100 (3.894 A–3.856 A) / 3.894 A or +1.0% and 100 (3.894 A –3.870 A) / 3.894 or +0.6% respectively for the a and b axes of $YBa_2CU_3O_{7-x}$.

If a slightly different lattice constant for the substrate is desirable, mixed single crystals of composition $LaGa_{1-x}Al_xO_3$ or $LaGa_{1-x}Sc_xO_3$, where x =0.001–0.2, can be grown to "tune" the lattice unit cell by virtue of the smaller ($Al^{3+}$) or larger ($Sc^{3+}$) ionic radii.

The substrate monocrystalline lanthanum orthogallate and/or "tuned" mixed single crystals of $LaGa_{1-x}Al_xO_3$ or $LaGa_{1-x}Sc_xO_3$, where x=0.0–0.2 should be substantially lattice-matched with the supported superconductor As used herein substantially lattice-matched means that the respective lattices of substrate and superconductor may vary ±2%. Preferably, the variation is ±1% or less.

To obtain the substrates of the present invention from a single crystal boule of $LaGaO_3$ or mixed crystals the procedure indicated below is typical.

After the $LaGaO_3$ oriented single crystal boule is grown, the ends are cut off flat by a saw. The boule is then polished on its ends for a complete optical inspection by ordinary an laser light. Another 1 mm slice from the boule is taken to perform a chemical etch test for defects and lattice constant measurement by X-ray diffractometer. The boule is then ground to a cylinder by centerless grinding for round substrates or ground flat for square wafers. The boule is next mounted on a top to perform an X-ray orientation to ±0.1°. The particular planes, e.g. (110) planes of $LaGaO_3$, are now parallel to each saw cut for a wafer. The boule is then completely cut into wafers on an inside diameter diamond wafering saw. Each wafer is about 1 mm thick for the rough cut. The wafers are mounted on metal blocks, lapped to flatness and parallelism by means of a planetary lapping machine, and then removed. Wafers are then given a chemical etch to remove all surface damage incurred by previous mechanical processes. The wafer are next polished by a Syton chemical-mechanical process to give a damage-free epitaxial growth surface. Wafers are then removed, inspected, cleaned, and ready for film deposition. Film deposition in the case of metal oxide based perovskite superconductors can be achieved in accordance with any of the well known deposition techniques for such superconductor materials. One acceptable procedure is that described by T. Venkatesan in the December, 1987 issue of *Solid State Technology* in his article entitled "Laser Deposited High To Superconducting Thin Films."

EXAMPLE I (Growth of $LaGaO_3$)

A single crystal of lanthanum orthellate ($LaGaO_3$) was grown in a furnace arrangement consisting of a 2×2 inch cylindrical iridium crucible supported by a ironic tube and entirely surrounded by zirconia grog for thermal insulation. Additional insulation for the from in crystal w provide by a 3×3 inch cylindrical zirconia sleeve situated above and concentric to the crucible. Power for melting the oxides and maintaining the crystal diameter was provided by a 350 K H induction generator supplying a 10 turn coil located external to a quartz tube which held the ceramic elements and crucible in place. The growth furnace was isolated from the ambient atmosphere by means of a water cooled metal enclosure.

A melt comprised of lanthanum orthogallate was established by introducing a stoichiometric mixture of 330.2 g of 99.99% purity lanthanum oxide and 189.8 g of 99 99% purity gallium oxide into the iridium crucible The component oxides are purchased as free flowing microcrystalline solid powders in a size range of approximately 1-10 um. Power to the crucible was increased until the contents were completely molten. In the absence of a lanthanum orthogallate seed, an iridium wire was then lower into the melt in order to nucleate a crystal Following initial crystallization, the wire was withdrawn at 1.25 m per hour while rotating at 25 rpm. The entire melting and crystal growth procedure wa conducted in a controlled atmosphere comprised of 99.5% $N_2$ flowing at 21 liter/minute and 0.5 % $CO_2$ flowing at 0.1 liter/minute.

An oxidizing atmosphere as chosen to Counteract the anticipated loss of gallium oxide through voltilization. Loss by this mechanism as found to be negligible, however. In addition, that melting point s found to be much lower the exerted. The temperature of the melt was approximately 1650° C.

The lanthanum orthogallate, as observed, congruently melted at or very near its stoichiometric composition. X-ray powder diffraction confirmed that the crystallized phase was lanthanum orthogallate.

The size of the grown crystal was 22 mm diameter $\times$ 84 m long, and its single crystal nature was confirmed by the appearance of well-defined spots in a Laue back reflection x-ray photograph. The axial orientation of the crystal was close to [110].

EXAMPLE II (Growth of $LaGaO_3$)

After the growth of the initial crystal, where a substantial portion (37%) of the melt was crystallized and removed, a second crystal was grown under the same conditions as before. Oxide components equal to the composition of the grown crystal, i.e. 121.9 g of $La_2O_3$ and 70.1 g of $Ga_2O_3$, were intimately mixed and added to the crucible containing the residual solidified melt. The component oxides are purchased as free flowing microcrytalline solid powdered in size renew of approximately 1-10 um. The temperature of the growth intention increased until the entire crucible contented had melted. An iridium wire wa then lowered into the melt and crystallization was conducted as before. The previous observation of a relatively low melting point and good melt stability were replicated. A substantial portion (36%) of the melt was again crystallized with no indication of changes in the crystallized phase associated with a deviating melt composition.

The crystal measured 19 in diameter and 102 mm in length and was contrite to b single crystal of [001] orientation by Laue x-ray back reflection.

An X-ray powder pattern confirmed the $LaGaO_3$ composition and lattice constants.

The above procedure of melt addition and regrowth is normally not attainable in other $Ga_2O_3$ containing systems, e.g. $Gd_3Ga_5O_{12}$, because of substantial deviations in composition brought about by $Ga_2O_3$ volatility.

EXAMPLE III (Growth of Mixed Crystals)

Mixed single crystals are prepared by fixing the proportions of $LaAlO_3$ and $LaGaO_3$ in the starting compositions. Since both compounds have nearly an identical perovskite structure, the X-ray lattice constants in the mixed crystal are proportional to the amount of each component. An example is given in Table I where the measured lattice constant of pure $LaAlO_3$, $LGaO_3$, and $LaScO_3$ are given. The calculated values for 50-50 mole % mixtures of $LaAlO_3$–$LaGO_3$ and $LaGaO_3$–$LaScO_3$ are given. Other intermediate values are achieved in similar manner.

TABLE I

| Compound | Lattice Constants of Perovskites | | |
|---|---|---|---|
| | a (A) | b (A) | c (A) |
| $LaAlO_3$ | 5.356 | 5.356 | 7.600 |
| *$LaAl_{0.5}Ga_{0.5}O_3$ | 5.438 | 5.425 | 7.685 |
| $LaGaO_3$ | 5.519 | 5.494 | 7.770 |
| *$LaGa_{0.5}Sc_{0.5}O_3$ | 5.600 | 5.640 | 7.934 |
| $LaScO_3$ | 5.678 | 5.787 | 8.098 |

*Calculated values.

EXAMPLE IV (Growth of Mixed Crystals to Attain a Specific Lattice Constant Match)

This example relates to the proper attainment of a near lattice constant match for a mixed crystal of $La_{1-31}xR_xGa_{1-y}Al_yO_3$ type where R is a smaller rare earth ion such as $Gd^{3+}$ or $Y^{3+}$. Suppose we wish to deposit a thin film of the $YBa_2Cu_3O_{7-x}$ compound on the (110) planes of an appropriate perovskite substrate to obtain minimum deviation from lattice match. We note that for $YBa_2Cu_3O_{7-x}$ the orthorhombic unit cell is a=3.856 A, b=3.870 A, and c=11.666 A from T. Siegrist et al., phys. Rev. B35, 7137 (1987).

Since one lattice spacing $d_{110}$ of a substrate may not exactly match more than one spacing of the film, we may want to choose an approximate compromise for the film, e.g. an average between the a =3.856 A and the b=3.870 a or 3.863 A. Thus, the design of substrate with a lattice spacing of 3.863 A is now considered. We do this with the assistance of Table II. The first five entries of Table II are measured orthorhombic lattice constants of pure phases of respective pervoskites. The last three entries are for proposed mixed crystal compositions which exactly satisfy the $d_{110}$ lattice spacing of the required 3.863 A. In these calculations it is assumed that a nearly linear change of a, b, or c is occurring with composition. Thus, the actual measured a, b, and c of the mixed crystal may deviate slightly from these calculated values. Other examples of lattice match procedures are evident from the above.

In order to prepare these mixed single crystals, appropriate molar ratios of the respective oxides are incorporated into the melt prior to crystal growth. For example, to prepare the $La_{0.6}Y_{0.4}GaO_3$ composition, 0.6 mole of $La_2O_3$, 0.4 mole of $Y_2O_3$, and 1.0 mole of $Ga_2O_3$ can be introduced into the crucible. Some correction may have to be made from segregation, since k=Cs/Cl may not be exactly 1 for Gd, Y, or Al in $LaGaO_3$. Examples for other mixed crystals are treated similarly.

TABLE II

Lattice Constants of Perovskites

|  | a | b | c | d 110 |
|---|---|---|---|---|
| LaAlO$_3$ | 5.356 | 5.356 | 7.600 | 3.787 |
| LaGaO$_3$ | 5.519 | 5.494 | 7.770 | 3.894 |
| LaScO$_3$ | 5.678 | 5.787 | 8.098 | 4.053 |
| GdGaO$_3$ | 5.537 | 5.322 | 7.606 | 3.837 |
| YGaO$_3$ | 5.536 | 5.257 | 7.533 | 3.812 |
| *LaAl$_{0.3}$Ga$_{0.7}$O$_3$ | 5.470 | 5.453 | 7.719 | 3.863 |
| *La$_{0.5}$Gd$_{0.5}$GaO$_3$ | 5.527 | 5.405 | 7.686 | 3.863 |
| *La$_{0.6}$Y$_{0.4}$GaO$_3$ | 5.528 | 5.387 | 7.628 | 3.863 |

*Calculated

As is evident from the foregoing various modifications can be made without departing from the spirit of the invention. It is not intended to limit the invention to the details heretofore recited, the invention being defined in the claims which follow.

We claim:

1. In a superconducting device comprising a high Tc superconducting thin film of metal oxide based perovskite deposited on a crystalline substrate, the improvement which comprises providing as the crystalline substrate of said device (1) monocrystalline lanthanum orthogallate grown from a pure melt of lanthanum and gallium oxides while controlling the major crystallographic direction of solidification or (2) a mixed single crystal of lanthanum orthogallate grown from a melt of lanthanum, gallium and additive oxides while controlling the major crystallographic direction of solidification.

2. The superconducting device of claim 1, wherein the crystalline substrate is monocrystalline lanthanum orthogallate.

3. The superconducting device of claim 1, wherein the mixed single crystal of lanthanum orthogallate has the following formula:

$$R_xLa_{1-x}Ga_{1-y}Q_yO_3$$

wherein R is Y or a rare earth element of smaller ionic radius than La; Q is Sc, Al or In; and, x and y are the same or different and have a value of from 0.001 to 0.5.

4. The superconducting device of claim 3, wherein R is Gd, Yb, Lu or Y.

5. The superconducting device of claim 3, wherein Q is Al.

6. The superconducting device of claim 3, wherein Q is Sc.

7. The superconducting device of claim 3, wherein Q is In.

8. The superconducting device of claim 3, wherein the mixed single crystal of lanthanum orthogallate has the following formula:

$$LaGa_{1-y}Sc_yO_3$$

wherein y has a value of from 0.001 to 0.5.

9. The superconducting device of claim 3, wherein the mixed single crystal of lanthanum orthogallate has the following formula:

$$LaGa_{1-y}Al_yO_3$$

wherein y has a value of from 0.001 to 0.5.

10. The superconducting device of claim 3, wherein the mixed single crystal of lanthanum orthogallate has the following formula:

$$LaGa_{y_{1-y}}In_yO_3$$

wherein y has a value of from 0.001 to 0.5.

* * * * *